United States Patent
Schmidbauer et al.

(10) Patent No.: US 8,652,890 B2
(45) Date of Patent: Feb. 18, 2014

(54) METHODS FOR FABRICATING INTEGRATED CIRCUITS WITH NARROW, METAL FILLED OPENINGS

(75) Inventors: Sven Schmidbauer, Dresden (DE); Dina H. Triyoso, Dresden (DE); Elke Erben, Dresden (DE); Hao Zhang, Dresden (DE); Robert Binder, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 24 days.

(21) Appl. No.: 13/408,291

(22) Filed: Feb. 29, 2012

(65) Prior Publication Data

US 2013/0224927 A1    Aug. 29, 2013

(51) Int. Cl.
*H01L 21/338*    (2006.01)

(52) U.S. Cl.
USPC ........... 438/183; 438/197; 438/287; 438/591; 438/653; 438/685; 257/412; 257/E21.333; 257/E21.19; 257/E29.15

(58) Field of Classification Search
None
See application file for complete search history.

(56) References Cited

U.S. PATENT DOCUMENTS

| | | | | |
|---|---|---|---|---|
| 4,829,024 A * | 5/1989 | Klein et al. | | 438/14 |
| 5,943,600 A * | 8/1999 | Ngan et al. | | 438/653 |
| 6,057,234 A * | 5/2000 | Yamazaki | | 438/660 |
| 6,465,290 B1 * | 10/2002 | Suguro et al. | | 438/183 |
| 6,607,958 B2 * | 8/2003 | Suguro | | 438/287 |
| 6,916,695 B2 * | 7/2005 | Wakabayashi et al. | | 438/199 |
| 8,030,718 B2 * | 10/2011 | Huang et al. | | 257/412 |
| 2011/0140207 A1 * | 6/2011 | Lin et al. | | 257/412 |
| 2011/0272764 A1 * | 11/2011 | Kim | | 257/368 |
| 2012/0322218 A1 * | 12/2012 | Lai et al. | | 438/303 |
| 2012/0326243 A1 * | 12/2012 | Huang et al. | | 257/410 |
| 2013/0017678 A1 * | 1/2013 | Tsai et al. | | 438/591 |
| 2013/0037889 A1 * | 2/2013 | Liao et al. | | 257/411 |

* cited by examiner

*Primary Examiner* — Zandra Smith
*Assistant Examiner* — Khanh Duong
(74) *Attorney, Agent, or Firm* — Ingrassia Fisher & Lorenz, P.C.

(57) ABSTRACT

Methods are provided for fabricating an integrated circuit that includes metal filled narrow openings. In accordance with one embodiment a method includes forming a dummy gate overlying a semiconductor substrate and subsequently removing the dummy gate to form a narrow opening. A layer of high dielectric constant insulator and a layer of work function-determining material are deposited overlying the semiconductor substrate. The layer of work function-determining material is exposed to a nitrogen ambient in a first chamber. A layer of titanium is deposited into the narrow opening in the first chamber in the presence of the nitrogen ambient to cause the first portion of the layer of titanium to be nitrided. The deposition of titanium continues, and the remaining portion of the layer of titanium is deposited as substantially pure titanium. Aluminum is deposited overlying the layer of titanium to fill the narrow opening and to form a gate electrode.

17 Claims, 3 Drawing Sheets

METHODS FOR FABRICATING INTEGRATED CIRCUITS WITH NARROW, METAL FILLED OPENINGS

TECHNICAL FIELD

The present invention generally relates to methods for fabricating integrated circuits, and more particularly relates to methods for fabricating integrated circuits having narrow, metal filled openings.

BACKGROUND

The semiconductor industry is continuously moving toward the fabrication of larger and more complex integrated circuits (ICs). As integrated circuits become larger, the size of individual components making up those ICs and the minimum feature size (minimum line width or spacing) of those components gets smaller. The smaller feature sizes increase processing complexity, difficulty, and reliability in various ways. The ability to reliably fill deep, narrow (i.e., high aspect ratio) openings with metal, for example, is one such complexity. High aspect ratio openings occur, for example, in providing metal gates in a replacement gate technology.

Accordingly, it is desirable to provide methods for fabricating integrated circuits having narrow, metal filled openings. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuits that include narrow, metal filled openings. In accordance with one embodiment, a method includes forming a dummy gate overlying a semiconductor substrate and subsequently removing the dummy gate to form a narrow opening. A layer of high dielectric constant insulator and a layer of work function-determining material are deposited overlying the semiconductor substrate. The layer of work function-determining material is exposed to a nitrogen ambient in a first chamber. A layer of titanium is deposited into the narrow opening in the first chamber in the presence of the nitrogen ambient to cause the first portion of the layer of titanium to be nitrided. The deposition of titanium continues, and the remaining portion of the layer of titanium is deposited as substantially pure titanium. Aluminum is deposited overlying the layer of titanium to fill the narrow opening and to form a gate electrode.

In accordance with a further embodiment an integrated circuit is fabricated by forming a layer of insulating material overlying a semiconductor substrate and having a narrow opening therein. A layer of electrically conductive material is deposited into the narrow opening, the layer of electrically conductive material having a chemical composition graded from a first portion that forms a barrier material in contact with the layer of insulating material to a second overlying portion that forms a wetting material. A metal is deposited overlying the second portion of wetting material and filling the narrow opening.

In accordance with yet another embodiment an integrated circuit is fabricated by forming a dummy gate electrode overlying a semiconductor substrate. The dummy gate electrode is removed to leave a narrow opening, and a layer of material is deposited in the narrow opening, the layer of material having a chemical composition graded from a barrier material to a wetting material. A layer of metal is deposited overlying the wetting material to fill the narrow opening and to form a gate electrode.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
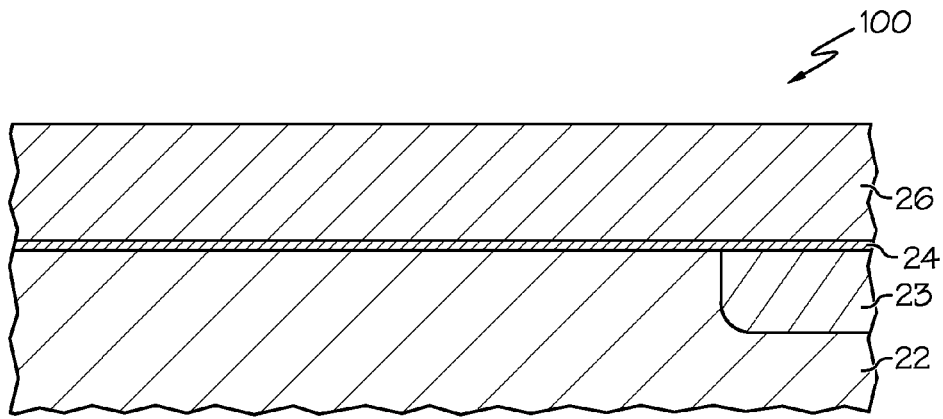
FIGS. 1-6 schematically illustrate, in cross section, methods for fabricating an integrated circuit in accordance with various embodiments.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

A field effect transistor (FET) includes a gate electrode as a control electrode and spaced apart source and drain regions formed in a semiconductor substrate and between which a current can flow. A control voltage applied to the gate electrode controls the flow of current through a channel between the source and drain regions. The gate electrode is electrically insulated from the underlying channel by a gate dielectric. Such FETs can be P-channel (PFET) or N-channel (NFET). A FET integrated circuit (IC) can incorporate a large number of FETs, either PFET or NFET, or both. As the number of FETs included in the IC increases, it becomes important to decrease the size of features of each transistor. It is also important to maintain or even improve the performance of the transistors. One way to improve the performance of a FET is to use a high dielectric constant (high k) material as the gate dielectric. Another way is to form the gate electrode of a high conductivity metal. A process for effectively combining a high k gate dielectric with a metal gate in the fabrication of high performance FETs is the replacement gate process in which a dummy gate is initially formed, subsequently removed, and replaced by the desired metal gate. The replacement of the dummy gate by the metal gate involves filling the opening left by the removal of the dummy gate with the desired metal. In a high performance process having small feature sizes, the opening that must be filled is a narrow, high aspect ratio opening that is difficult to fill reliably with conventional processing. In addition to providing a void-free filling of the narrow opening, it is necessary to provide a barrier layer to separate the metal fill material from the underlying gate insulator as well as from the insulator material surrounding the opening and to provide a wetting layer to insure adhesion and flow of the fill material.

FIGS. 1-6 schematically illustrate, in cross section, methods for fabricating integrated circuits in accordance with various embodiments. The methods include steps for reliably filling narrow openings with metal. The methods are particularly applicable to forming replacement metal gates of field effect transistor ICs, and will be so illustrated in exemplary embodiments, but the methods are not limited to such applications. The methods described herein are applicable to the filling of any opening with a deposited metal. Various steps in the fabrication of FET semiconductor integrated circuits are well known and so, in the interest of brevity, many conventional fabrication steps will only be mentioned briefly herein or will be omitted entirely without providing the well-known process details.

FIG. 1 illustrates a portion of an IC 100, specifically a FET IC, at an early stage in its fabrication. Only a portion of IC 100 is shown, and that portion will include a PFET 20 as illustrated in the following FIGURES. IC 100 may include a large number of FETs, PFET and/or NFET, and the methods described herein may be applied to many or even all of the FETs that make up IC 100. The method begins by providing a semiconductor substrate 22. The semiconductor substrate can be silicon, silicon admixed with germanium or other elements, or other semiconductor materials such as germanium commonly used for the fabrication of ICs, and can be either a bulk semiconductor wafer or a thin layer of semiconductor material on an insulating layer (SOI). Although not illustrated, substrate 22 can be selectively doped with conductivity-determining impurities, for example by ion implantation, to form doped wells or regions. Shallow trench isolation (STI) 23 or other forms of isolation may be formed in the substrate to provide electrical isolation between various regions as required by the circuit being implemented. In accordance with one embodiment, a thin layer of insulating material 24 is deposited or grown overlying the substrate and a layer of dummy gate electrode material 26 such as polycrystalline silicon is deposited over insulating material 24.

Figure 2:
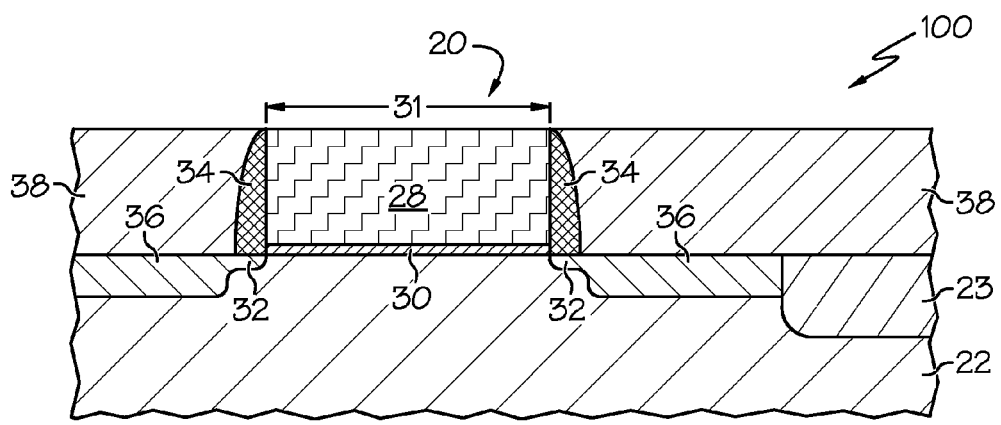

The method continues, in accordance with one embodiment, by patterning the layer of dummy gate electrode material 26 and underlying insulator material 24 to form a dummy gate structure including a dummy gate electrode 28 and a dummy gate insulator 30 as illustrated in FIG. 2. The width of dummy gate electrode 28, as indicated by double headed arrow 31, is selected to achieve the desired channel length of the PFET being fabricated. Dummy gate electrode 28 is used as an ion implantation mask and P-type conductivity determining ions such as boron ions are implanted into substrate 22 to form source and drain extensions 32 in self alignment with the dummy gate electrode. Although not illustrated, halo implants may also be carried out using the dummy gate electrode as an implantation mask. Sidewall spacers 34 are formed on the walls of dummy gate electrode 28. The sidewall spacers can be formed, for example, by depositing and anisotropically etching, for example by reactive ion etching (RIE), a layer of sidewall spacer material such as an insulating layer of oxide or nitride. The dummy gate electrode and the sidewall spacers are then used as an ion implantation mask and ions such as boron ions are implanted into substrate 22 to form deep source and drain regions 36, again in self alignment with dummy gate electrode 28. A layer of insulating material 38 such as a layer of silicon oxide is deposited and planarized to fill the space between dummy gate electrode 28 and neighboring dummy gate electrodes. The layer of insulating material can be deposited, for example, by chemical vapor deposition (CVD) from a tetraethyl orthosilicate (TEOS) source and can be planarized, for example, by chemical mechanical planarization (CMP) with the planarization stopping on the tops of the dummy gate electrodes.

Figure 3:
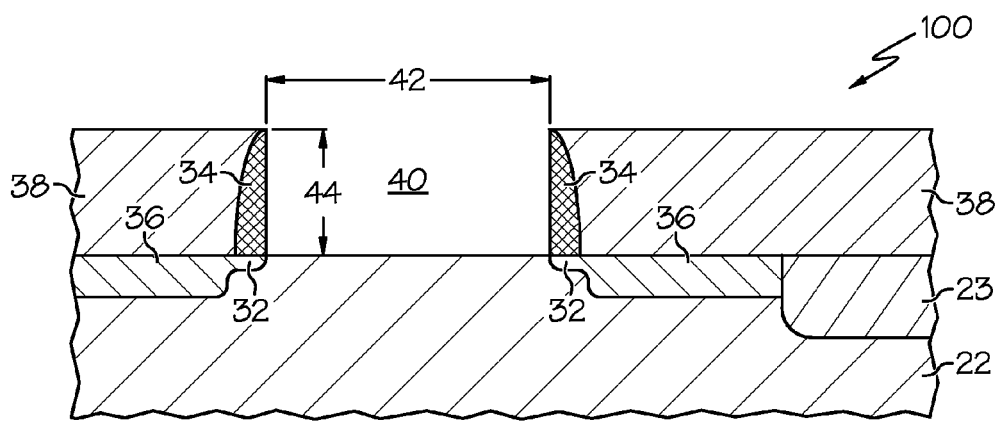

As illustrated in FIG. 3, the method for fabricating an IC in accordance with one embodiment continues by removing dummy gate electrode 28 and dummy gate insulator 30 to leave a narrow opening 40 where a final gate structure will be provided, as explained more fully below. In this context, "narrow" means having a final width, after the deposition of a layer of work function-determining material as described below, indicated by double headed arrow 42, of about 7 to about 15 nanometers (nm) and typically has a height as indicated by double headed arrow 44 of about 35 to about 40 nm.

Figure 4:
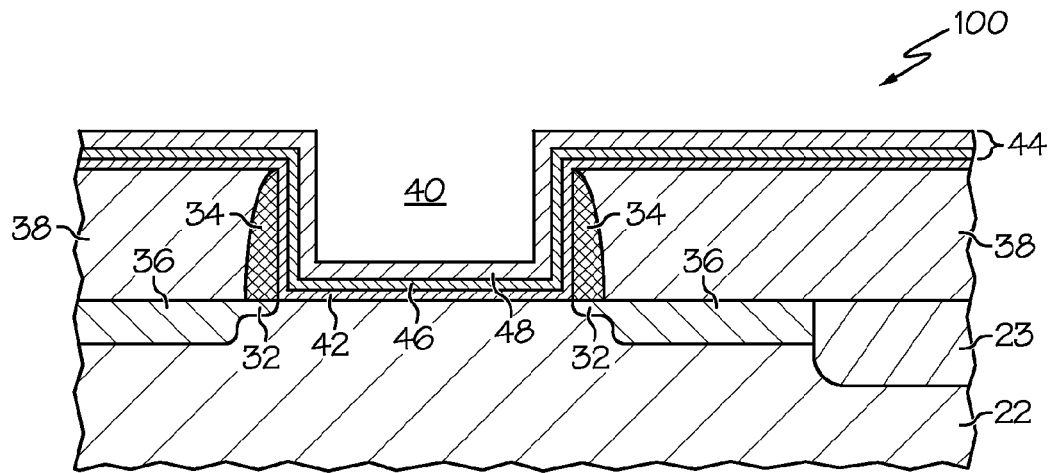

After removing the dummy gate structure, a permanent gate insulator 42 is formed in narrow opening 40 as illustrated in FIG. 4. The permanent gate insulator can be, for example, a silicon oxide or a high k dielectric material such as an oxide of hafnium, or a combination of silicon oxide and high k material. In accordance with one exemplary embodiment, a layer of hafnium oxide having a thickness of about 1-10 nm is deposited by atomic layer deposition (ALD). A layer of work function-determining material 44 is deposited overlying the layer of permanent gate insulator. For a PFET, the work function-determining material can be, for example, a layer of titanium and aluminum (referred to hereinafter for convenience as TiAl, although without implying that the layer includes equal amounts of titanium and aluminum). In accordance with one embodiment, a layer of TiAl is deposited to a thickness of about 6-10 nm by a process of physical vapor deposition (PVD), for example by sputtering from a TiAl sputtering source. Although not illustrated, an etch stop layer, such as a thin layer of TaN may be deposited before the layer of work function-determining material. The etch stop layer is useful in a process in which different work function-determining materials are used on PFETs and NFETs. The TiAl and TaN, deposited by PVD, add coverage of the bottom of the narrow opening, but little sidewall coverage.

In accordance with one embodiment, layer of work function-determining material 44 includes two different layer portions. If the material is TiAl as described above, the bottom portion 46 is pure TiAl and the upper portion 48 is nitrided TiAl, hereinafter referred to as TiAlN. Layer 44 can be deposited as a pure TiAl layer that is subsequently nitrided in a nitrogen ambient to convert the upper portion to TiAlN. In accordance with one embodiment lower portion 46 can have a thickness of about 4 nm and upper portion 48 can also have a thickness of about 4 nm.

Figure 5:
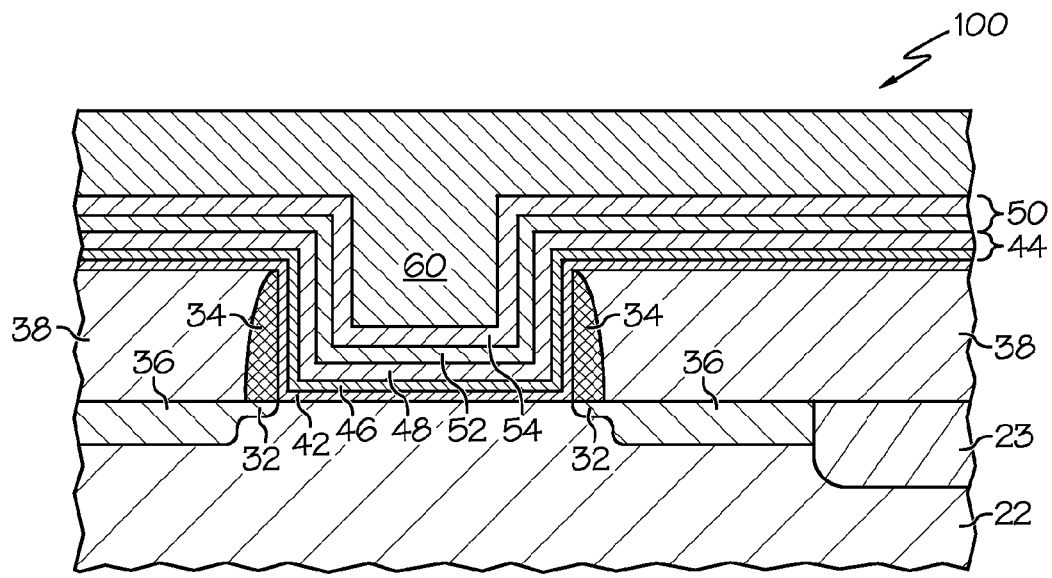

As illustrated in FIG. 5, the method for fabricating an integrated circuit continues, in accordance with one embodiment, by forming an electrically conductive graded layer 50 overlying layer 44 of work function-determining material. The chemical composition of graded layer 50 is graded in such a manner to provide both a barrier layer 52 and a wetting layer 54. Graded layer 50 can be, for example, a layer that contains titanium and that also, in barrier layer 52, contains nitrogen. That is, graded layer 50 can be a titanium layer in which the chemical composition is graded from nitrogen rich ($TiN_x$, x much greater than zero) at the interface with the work function-determining material to substantially nitrogen free at the upper surface. By substantially nitrogen free means $TiN_x$, x less than about 0.2. The nitrogen rich portion forms barrier layer 52 and the substantially nitrogen free portion forms wetting layer 54. The nitrogen rich portion must have sufficient nitrogen to act as a barrier to the diffusion of the subsequently deposited gate electrode material.

In accordance with one embodiment, graded layer 50 is deposited by sputtering from a titanium sputtering target in the same reaction chamber and in the same nitrogen ambient used to nitride the upper portion of layer 44 of work function-determining material. The residual nitrogen ambient causes the initial deposition from the titanium sputtering target to be nitrogen rich. As the residual nitrogen is exhausted and the ambient become inert, the layer being deposited contains less and less nitrogen so that the chemical composition of the deposited layer is graded from nitrogen rich to substantially nitrogen free pure titanium. In accordance with an exemplary embodiment, graded layer 50 has a total thickness of about 10 to about 30 nm and, of that, nitrogen rich barrier layer 52 has a thickness of about 3 to about 5 nm. Nitriding layer 50, to form barrier layer 52, in the same reaction chamber and the same nitrogen ambient used to nitride work function-determining material layer 44, allows self-pasting of the sputtering target and the reaction chamber so that consistent results can be achieved with each wafer that is processed. That is, each semiconductor wafer that is subjected to the described process sees the same process conditions.

A layer of metal 60 is deposited over wetting layer 54 to fill the narrow opening. In accordance with one embodiment, metal 60 is aluminum, deposited by PVD or CVD. The aluminum can be heated to a temperature of about 400° C. or more to cause the aluminum to flow and completely fill the narrow opening. Returning to the definition of "nitrogen free" in describing the wetting layer, if fill material 60 is aluminum, the wetting layer must be sufficiently free of nitrogen so that the surface of the wetting layer is able to form $TiAl_x$ following the deposition and anneal of the aluminum. Alternatively, layer of metal 60 can be tungsten, which also requires a robust barrier layer and wetting layer, or other conductive material.

Figure 6:
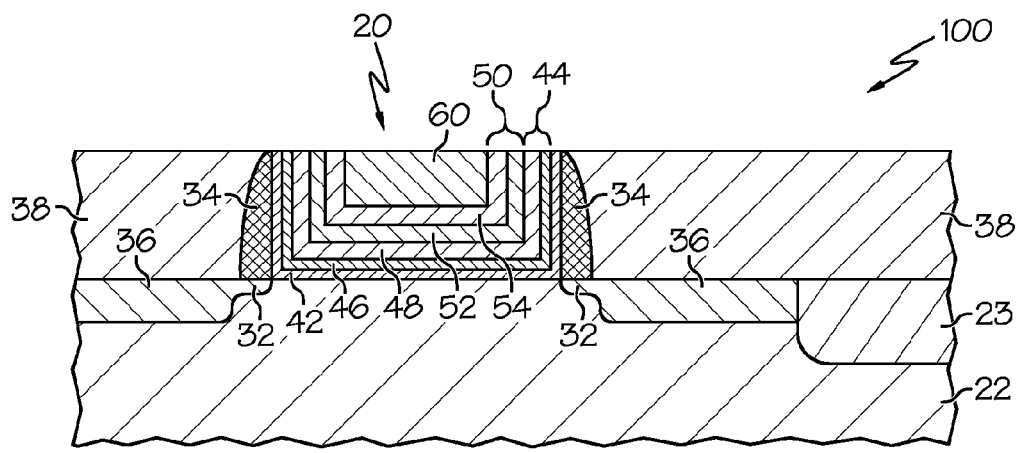

As illustrated in FIG. 6, the method in accordance with one embodiment continues by planarizing layer of metal 60 and the other layers overlying insulator 38. The metal, graded titanium layer 50, work function-determining layer 44 and gate insulator 42 can be removed, for example, by CMP. The residual portion of metal 60, filling narrow opening 40 forms the permanent gate electrode of PFET 20.

Although not illustrated, in accordance with a further embodiment, the high k gate insulator can be formed before the deposition of dummy gate electrode forming material 26 rather than after the removal of dummy gate electrode 28. In accordance with yet another embodiment, both the high k gate insulator and the layer of work function-determining material can be formed before the deposition of the dummy gate electrode forming material 26. In accordance with that embodiment, the upper portion of the layer of work function-determining material is nitrided after removing the dummy gate electrode and immediately before the deposition of layer 50.

Figure 7:
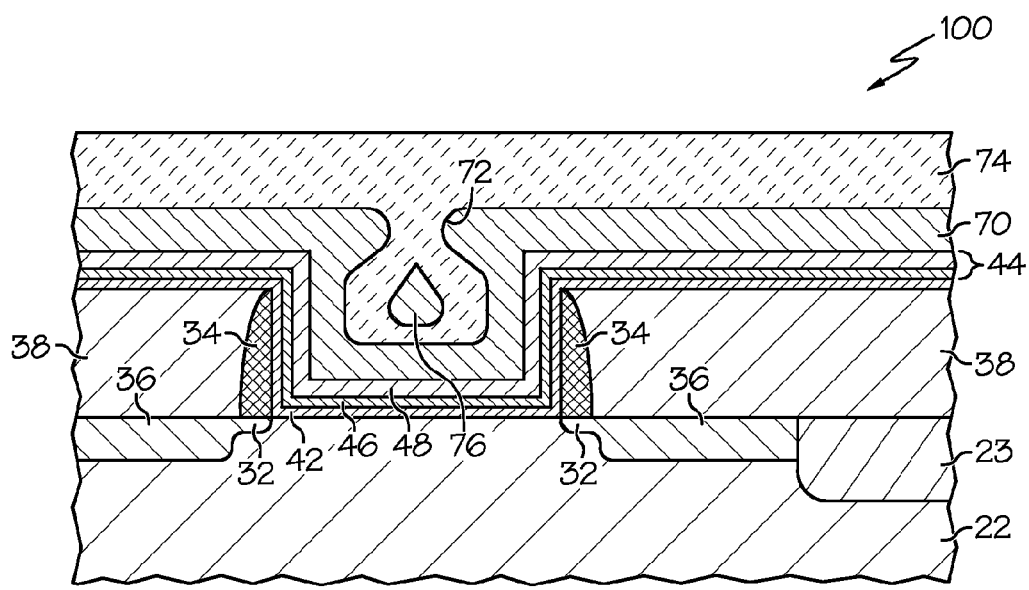
FIG. 7 schematically illustrates, in cross section, a prior art structure and problems associated with prior art fabrication methods.

In contrast to the embodiments described above, FIG. 7 illustrates problems associated with prior art processes. In prior art processes a thick layer of titanium 70 was deposited onto the layer of work function-determining material 44 in the structure shown in FIG. 4. The layer of titanium had to be of sufficient thickness to serve as both a barrier layer and as a wetting layer. Depositing a layer of such thickness results in the formation of thickened regions or "shoulders" 72 around the rim of the narrow opening because of the layer is typically deposited by PVD. The presence of the shoulders makes it difficult to reliably fill the narrow opening with aluminum or other metal 74, often resulting in voids 76. Such voids ultimately lead to yield reductions and are undesirable.

While various exemplary embodiments have been presented in the foregoing detailed description, it should be appreciated that a vast number of additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
    forming a dummy gate electrode overlying a semiconductor substrate;
    removing the dummy gate electrode to form a narrow opening;
    depositing a layer of high dielectric constant insulator and a layer of work function-determining material overlying the semiconductor substrate;
    exposing the layer of work function-determining material to a nitrogen ambient in a reaction chamber;
    depositing a layer of titanium different from the layer of work function-determining material into the narrow opening in the reaction chamber in the presence of the nitrogen ambient wherein a first portion of the layer of titanium is nitrided by the nitrogen ambient and a remaining portion of the layer of titanium is deposited as substantially pure titanium; and
    depositing aluminum overlying the remaining portion of the layer of titanium to fill the narrow opening and to form a gate electrode of the integrated circuit.

2. The method of claim 1 wherein depositing a layer of work function-determining material comprises depositing a layer comprising titanium and aluminum and wherein the layer comprising titanium and aluminum is nitrided by exposure to the nitrogen ambient.

3. The method of claim 1 wherein depositing a layer of titanium comprises depositing a layer of titanium having a thickness of about 10 nm to about 30 nm.

4. The method of claim 3 wherein depositing a layer of titanium comprises nitriding the first portion of the layer of titanium to a thickness of about 3 nm to about 5 nm.

5. The method of claim 1 further comprising:
    depositing a layer of oxide overlying the dummy gate electrode; and
    planarizing the layer of oxide by chemical mechanical planarization.

6. The method of claim 5 further comprising planarizing the layer of aluminum and the layer of work function-determining material to remove a portion of the layer of aluminum and the layer of work function-determining material overlying the layer of oxide.

7. The method of claim 1 wherein depositing a layer of titanium comprises sputtering from a titanium target in the same chamber as the nitridation of the work function-determining material.

8. The method of claim 1 further comprising heating the aluminum to a temperature greater than or equal to 400° C. to reflow the aluminum.

9. The method of claim 1 further comprising forming source and drain regions in alignment with the dummy gate electrode.

10. A method for fabricating an integrated circuit comprising:
    forming a layer of insulating material overlying a semiconductor substrate and having a narrow opening therein;
    depositing a layer of electrically conductive material into the narrow opening, the layer of electrically conductive material having a chemical composition graded from a first portion comprising a barrier material in contact with the layer of insulating material to a second overlying portion comprising a wetting material, wherein depositing the layer of electrically conductive material comprises sputter depositing a layer of titanium in a nitrogen ambient during deposition of a first portion of the layer of titanium, wherein the first portion of the layer of titanium comprises $TiN_x$ and wherein a second overlying portion of the layer of titanium comprises substantially pure titanium; and depositing a metal overlying the second portion and filling the narrow opening.

11. The method of claim 10 further comprising heating the metal to cause the metal to reflow.

12. The method of claim 10 wherein depositing a metal comprises depositing aluminum.

13. A method for fabricating an integrated circuit comprising:

forming a dummy gate electrode overlying a semiconductor substrate;

removing the dummy gate electrode to leave a narrow opening;

depositing a layer of work function-determining material;

nitriding the layer of work function-determining material in a nitrogen ambient;

depositing a layer of material in the narrow opening after depositing the layer of work function-determining material, the layer of material having a chemical composition graded from a barrier material to a wetting material; and depositing a layer of metal overlying the wetting material to fill the narrow opening and form a gate electrode.

14. The method of claim 13 wherein depositing a layer of material comprises depositing a layer comprising titanium graded from $TiN_x$ to substantially pure titanium.

15. The method of claim 14 wherein depositing a layer of material comprises sputtering titanium initially in a nitrogen ambient to form the $TiN_x$ and then in an inert ambient to deposit the substantially pure titanium.

16. The method of claim 13 wherein depositing a layer of work function material comprises sputter depositing an alloy of aluminum and titanium in a nitrogen ambient.

17. The method of claim 16 wherein depositing a layer of material comprises depositing a layer comprising titanium in the nitrogen ambient.

* * * * *